(12) United States Patent
Lin et al.

(10) Patent No.: US 12,197,138 B2
(45) Date of Patent: Jan. 14, 2025

(54) MACHINE LEARNING ON OVERLAY MANAGEMENT

(71) Applicant: Taiwan Semiconductor Manufacturing Co., Ltd., Hsinchu (TW)

(72) Inventors: Tzu-Cheng Lin, Hsinchu (TW); Chien Rhone Wang, Hsinchu (TW); Kewei Zuo, Hsinchu (TW); Ming-Tan Lee, Hsinchu (TW); Zi-Jheng Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 996 days.

(21) Appl. No.: 17/185,827

(22) Filed: Feb. 25, 2021

(65) Prior Publication Data

US 2022/0269184 A1    Aug. 25, 2022

(51) Int. Cl.
*G03F 7/00* (2006.01)
*G06F 30/27* (2020.01)
*G06F 30/398* (2020.01)
*G06N 20/00* (2019.01)

(52) U.S. Cl.
CPC .... *G03F 7/706841* (2023.05); *G03F 7/70633* (2013.01); *G03F 7/706837* (2023.05); *G06F 30/27* (2020.01); *G06F 30/398* (2020.01); *G06N 20/00* (2019.01)

(58) Field of Classification Search
None
See application file for complete search history.

(56) References Cited

U.S. PATENT DOCUMENTS

| | | | |
|---|---|---|---|
| 7,449,265 B1 | 11/2008 | Dixon | |
| 9,341,962 B2 * | 5/2016 | Wahlsten | G03F 9/7003 |
| 10,964,566 B2 * | 3/2021 | Lin | H01L 21/67259 |
| 11,029,359 B2 * | 6/2021 | Honda | G01R 31/31835 |
| 11,626,304 B2 * | 4/2023 | Lin | G05B 19/19 |
| | | | 700/121 |
| 11,687,010 B2 * | 6/2023 | Li | H01L 21/682 |
| | | | 355/67 |

(Continued)

FOREIGN PATENT DOCUMENTS

| | | |
|---|---|---|
| CN | 102656678 A | 9/2012 |
| TW | 201234516 A | 8/2012 |
| TW | 202020577 A | 6/2020 |

OTHER PUBLICATIONS

D. H. Wolpert, "Stacked Generalization," Neural Networks, Dec. 1992, pp. 1-57. (Year: 1992).*

(Continued)

*Primary Examiner* — Leigh M Garbowski
(74) *Attorney, Agent, or Firm* — Seed IP Law Group LLP

(57) ABSTRACT

The current disclosure describes techniques for managing vertical alignment or overlay in semiconductor manufacturing using machine learning. Alignments of interconnection features in a fan-out WLP process are evaluated and managed through the disclosed techniques. Big data and machine learning are used to train a classification that correlates the overlay error source factors with overlay metrology categories. The overlay error source factors include tool signals. The trained classification includes a base classification and a Meta classification.

20 Claims, 7 Drawing Sheets

(56) References Cited

U.S. PATENT DOCUMENTS

| | | | |
|---|---|---|---|
| 2016/0148850 A1* | 5/2016 | David | G03F 7/70633 |
| | | | 355/53 |
| 2020/0006102 A1* | 1/2020 | Lin | G03F 7/70633 |
| 2022/0035256 A1* | 2/2022 | Zhang | G03F 7/7085 |

OTHER PUBLICATIONS

S. Dzeroski et al., "Is Combining Classifiers Better than Selecting the Best One?," Machine Learning, vol. 54, No. 3, pp. 255-273, 2004. (Year: 2007).*

S.J. Kim et al., "Hybrid Overlay Modeling for Field-by Field Error Correction in the Photolithography Process," IEEE Trans on Semiconductor Manufacturing, vol. 33, No. 1, Feb. 2020, pp. 53-61. (Year: 2020).*

* cited by examiner

MACHINE LEARNING ON OVERLAY MANAGEMENT

BACKGROUND

With the evolving of semiconductor technologies, semiconductor dies are becoming increasingly smaller, while increasingly more functions are integrated into a single die. Accordingly, increasingly greater number of I/O pads need to be included in an integrated circuit (IC) package together with smaller areas of die surfaces. Fan-out type wafer level packaging (WLP) became a promising packaging technology to tackle this challenging scenario. In fan-out WLP, dies are severed from the original front-end wafers before they are positioned on a carrier wafer to package with connection wirings and I/O pads. In the fan-out WLP process, an advantage is that the I/O pads associated to a die can be redistributed to a greater area than the surface of the die itself. As such, the number of I/O pads packed together with a die can be increased.

The fan-out WLP package may be used to pack one die, multiple dies side-by-side or multiple dies in a package-on-package (POP) vertical configuration. The POP configuration in fan-out WLP is achieved through interconnection features, such as a via, that connect multiple dies vertically. For example, under integrated fan-out InFO technology, the InFO_POP architecture is a package-on-package configuration that contains a DRAM die connected by a through-InFO via (TIV), while the InFO_M package contains one or more dies, e.g., logic and memory dies, that can be placed side by side.

Overlay metrology processes are used to monitor and control vertical alignments in various semiconductor manufacturing processes. An overlay metrology generally specifies how accurately a first patterned layer or a feature thereon aligns with respect to a second patterned layer disposed at a different vertical level from the first patterned layer, e.g., vertical alignment. An overlay error refers to a misalignment between a first part on the first patterned layer to a second part on the second patterned layer. An overlay error metrology, e.g., measurements, may be measured based on an offset between the first part and the second part or between an actual position of the first part and a target position of the first part. The target position may be determined based on advanced process control (APC) in wafer processing.

In fan-out WLP, tested-good dies are positioned onto a carrier wafer. Layers of interconnection features are formed connecting the die to the associated I/O pads and among the various layers of interconnections themselves. The interconnections are formed through wafer level processes, where photoresist and photolithography processes are used similarly as in the front-end wafer fabrication processes. Therefore, vertical alignments between or among sequential layers of the interconnections need to be managed.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Figure 1:
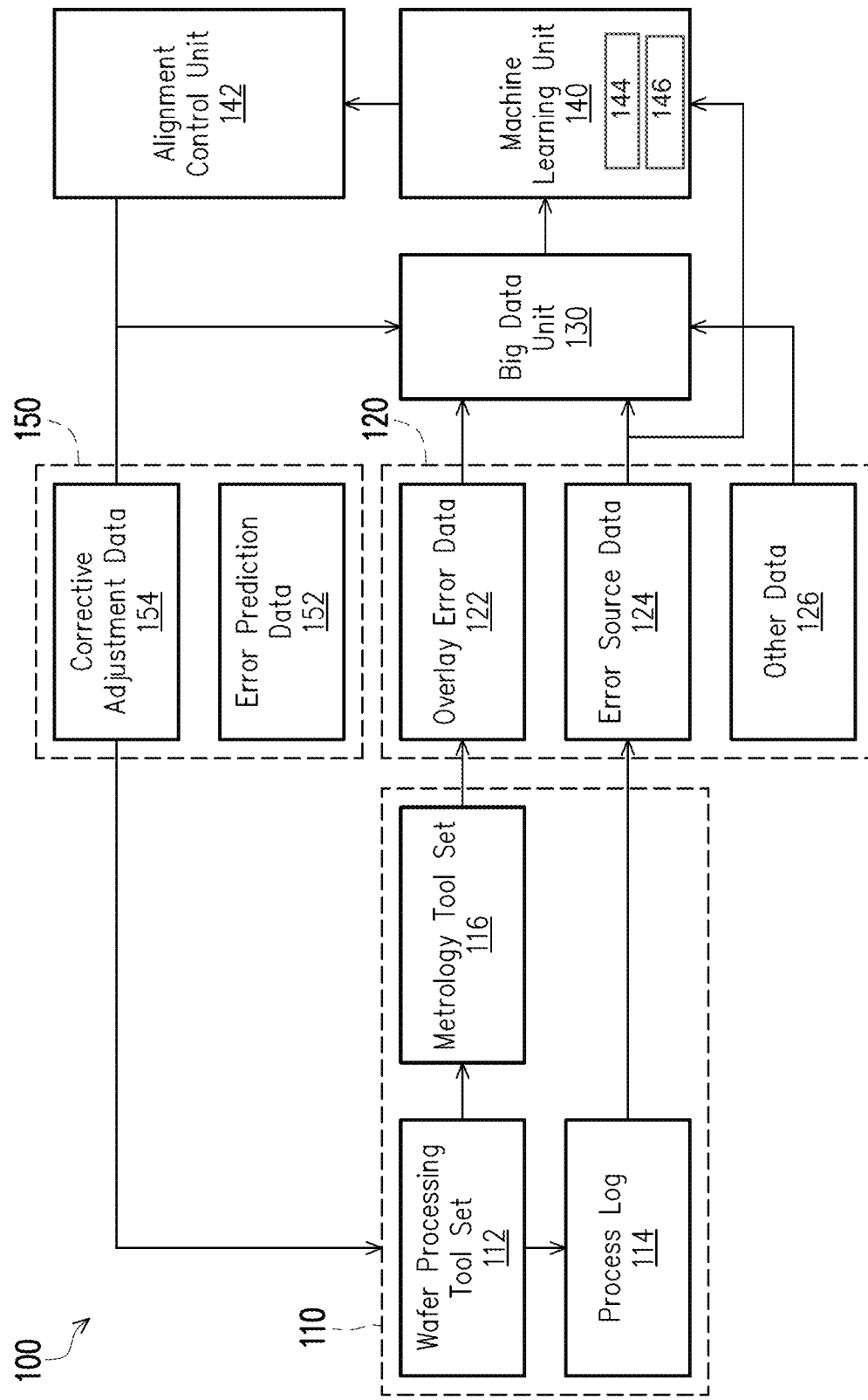
FIG. 1 is an example system for managing overlay alignment.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The current disclosure describes techniques for managing vertical alignment or overlay in semiconductor manufacturing using machine learning. For example, alignments of interconnection features in a fan-out WLP process are evaluated and managed through the disclosed techniques. For example, in the back-end wafer level packaging, a degraded tool may bring about degraded capacity in forming features at expected locations on a wafer, which causes overlay alignment errors. For example, an alignment tool, e.g., an aligner, is used to determine the location of light exposure in patterning a mask layer for forming a through-InFO via (TIV). A degraded aligner tool may have an increased variation in tool output signals, which causes increased position shift of a TIV formed by the aligner tool. As such, the TIV may partially or completely misalign with a corresponding connection feature, e.g., a bump, of a package that is supposed to connect with the TIV. The disclosed techniques analyzes tool signals of an alignment tool, e.g., the tool output signals, with respect to the overlap metrology measurements of the same tool using machine learning to correlate the tool signals with the overlay metrology values. The learned correlation, referred to as a "classification," is used to predict the overlay metrology of features on a workpiece that are processed by the alignment tool. For example, the tool signals of the alignment tool in processing the workpiece are obtained and applied into the learned classification to predict the overlap metrology of features on the workpiece.

The tool signals include any characteristics, properties or parameters of a tool in processing the workpiece to form a feature on the workpiece. The tool signals may include tool output signals, tool operating state signals, and tool positioning signals. The tool output signals may include electrical characteristics of an output signal of the tool, physical characteristics of the output signal of the tool or a combination of electrical characteristics and physical characteristics of the output signal. The tool signal may be measured as a differentiation of a signal of a tool with respect to a benchmark signal of the tool. In some embodiments, the tool signals are categorized as source factors of overlay metrology values. However, it is not necessary that the tool signals cause or lead to the overlay metrology values. The tool signals may only statistically correlate to the overlay metrology. Such statistical correlations may be sufficient for the purposes of predicting overlay metrology and correcting overlay errors, if any, although they do not necessarily represent any causal relationship between the tool signals and the overlay metrology.

The tool related overlay source factors include, but are not limited to, the aligner output signal characteristics, the light source position, the reticle position, the lens distortion, the scan direction, the stepper position at light exposure, the wafer stage position, or other tool signals. The tool signals may be detected by sensors embedded in the tools or external to the tools.

The overlay metrology data is also obtained. The overlay metrology data may include the measured overlay alignment offset information, e.g., overlay errors or acceptable overlay shifts. For example, the categories of the overlay errors include the sizes of the overlay alignment offset, e.g., in x-axis and y-axis, the rotation offset between the corresponding features, or the positions of the overlay errors, e.g., with respect to a wafer or with respect to a die.

The overlay source factor data, e.g., the tool signals, and the overlay metrology data are collected as corresponding to one another and stored in a data pool. In the data pool, a piece of overlay source factor data corresponds to a piece of overlay metrology data, which together form a data entry. In some embodiments, the data entries in the data pool are, e.g., randomly, allocated to a training data set, a validation data set and a test data set. The training data set is used to learn or fit parameters of a classification representing the relationship between the source factors and the overlay metrology. The validation data set is used to tune or adjust the classification parameters that are learned based on the training data set. The test data set is used to evaluate the generalization or performance of the final classification. In some embodiments, a stacked classification is used to represent the relationship between the overlay source factors and the overlay metrology. In these embodiments, the training data set is used to train the parameters of base classifications. The validation data set is used to train a Meta classification. Specifically, the overlay source data in the validation data set is input in the base classification to the actual overlay error data in the validation data set is used as output to train the Meta classification. After parameters of both the base classification and the Meta classification have been obtained through the trainings, the test data set is used to evaluate the generalization or performance of the stacked classification that includes the base classifications and the Meta classification.

In some embodiments, the training data set is fed into a machine learning model to learn parameters of a classification representing the relationship between the source factors, e.g., the tool signals, and the overlay metrology values. A Random Forest model, a neural networks model, an Inverse Distance Weighting k-Nearest Neighbors regression (IDW-kNN) model or other suitable machine learning models may be used as a machine learning model in correlating the overlay error source factors and the overlay metrology. A regression model function or a decision tree is obtained as a result of the machine learning.

The parameters of the classification may be validated using the validation data set. The classification parameters may be validated in various approaches, which are all included in the scope of the disclosure. For example, an estimated overlay metrology value based on overlay source data in the validation data set may be compared with a corresponding actual metrology measurement value in the validation data set. The difference between the estimated metrology value and the actual metrology value is used to adjust the classification parameters. After the validation procedure, the classification parameters are finalized.

The test data set is used to evaluate whether the finalized regression model function fits the data in the test data set. For example, in a case where the classification is a linear regression function, an R-squared value is used to determine whether the final classification fits the data in the test data set. The R-squared value indicates the scattering of the data points of the test data set around the fitted regression line, in which a variation is assessed between each data point and a predicted value by the linear regression line. In some embodiments, a threshold value may be used to determine whether the $R^2$ value meets the threshold. For another example, a threshold is used to evaluate each predicted overlay value with the actual overlay metrology value in the test data set. The threshold may be determined based on the overlay tolerance requirements of the features or layers that are formed in the wafer processing procedures. For example, in fan-out WLP, a threshold of about 0.1 μm may be chosen to determine whether an estimate overlay metrology value meets the actual metrology data of an interconnection feature on the fan-out WLP.

After the final classification has been determined as sufficiently fit, the final classification is used to predict overlay metrology value of a feature on a workpiece, e.g., an interconnection layer formed in the fan-out WLP packaging process. A corrective adjustment to the tool setting or other parameters or settings in forming the feature on the workpiece may be determined based on the predicted overlay metrology values.

In the disclosure herein, an overlay metrology process is illustrated with respect to a stepper machine as an example processing tool that brings about metrology errors, which is not meant to limit the scope of the disclosure. For example, the example stepper machine is a mask aligner machine. The disclosed techniques can also be used to predict overlay metrology with respect to other bumping alignment tools in, e.g., die attach die shift metrology or ball mount stencil alignment metrology. Further, the disclosed virtual overlay metrology techniques may also be applied with respect to front-end semiconductor process alignment tools or processes. A deviation tool signal, e.g., a difference between a detected characteristic and a benchmark characteristic of the stepper machine is used as an example tool signal to describe the techniques. Other tool signals are also possible, which are all included in the scope of the disclosure.

FIG. 1 is an example overlay management system 100. As shown in FIG. 1, the system 100 includes a wafer manufacturing on-site system 110, an input data set 120, a big data unit 130, a machine learning unit 140, and an output data set 150. The wafer manufacturing on-site system 110 includes a wafer processing tool set 112, e.g., a photolithography tool set, a process log 114 and a metrology tool set 116. The input data set 120 includes overlay error data 122, error source data 124, and other data 126. Other data 126 may be historical data on wafer processing including historical overlay error data, historical error source data and other data on wafer processing in addition to the wafer processing data obtained and maintained by the process log 114. The machine learning unit 140 may include or work together with an alignment control unit 142, a validation unit 144, and a test unit 146. The output data set 150 includes error prediction data 152 and corrective adjustment data 154 and other output data.

In operation, the wafer processing tool set 112 is configured to process a wafer, e.g., a carrier wafer with dies positioned thereon in an example fan-out WLP process to form interconnection layers over the dies. The wafer processing tool set 112 may be a photolithography tool and include, for example, a stepper machine "stepper", e.g., a step and repeat camera, a wafer stage or chuck, and a gantry tool and other suitable tools. A stepper passes light through a reticle, forming an image of the reticle pattern. The image is focused and reduced by a lens, and projected onto the surface of a wafer that is coated with a photoresist. A stepper works in a step-and-repeat manner where the pattern on the reticle is exposed repeatedly across the surface of the wafer in a grid. The stepper moves a wafer through the wafer stage as a step from one shot location to another. The step movement of the wafer may be conducted back and forth and left and right with the grid under the lens of the stepper.

In fan-out WLP, a gantry picks and positions a die onto a designated grid point or area on a carrier wafer. In some scenarios, more than one gantry tools are used to position dice onto a carrier wafer.

The process log 114 is configured to monitor, measure, determine and record wafer processing parameters related to the tool set 112 and the wafer processed by the tool set 112. Some or all of the wafer processing parameter data are identified as contributors or related to overlay errors and are consolidated into error source data 124.

After the wafer is processed by the wafer processing tool set 112 for a layer or a feature on the layer, the metrology tool set 116 is configured to measure the wafer to determine the overlay metrology data, e.g., whether an overlay error exists on the wafer with respect to the layer or the feature on the layer. The metrology data also includes details of an overlay error. In some embodiments, the overlay error metrology data is categorized into a position of the overlay error on the wafer or one die, an offset dimension of the overlay error in x-axis, and/or y-axis, or a rotation in angle of the overlay error. Some or all of the measurement results of the metrology tool set 116 are consolidated into the overlay error data 122. For the purposes of modeling the correlations between the error source factors and the overlay error categories, a scenario of no overlay error is also useful and may be collected as part of the overlay error data 122.

The big data unit 130 is configured to collect the overlay error data 122, the error source data 124 and other data 126 and to combine or harmonize the various data sets for further analysis. For example, the big data unit 130 links the different data categories of the overlay error data 122, the error source data 124 and the other data 126 together in various ways with respect to a wafer layer, a location on a wafer layer, a structure on a wafer layer, multiple vertical structures that are designed to vertically overlap or otherwise connect or couple to one another. In the description herein, a "feature" on a wafer is used to refer to any part of a wafer. For example, a feature on a wafer may be an interconnection structure. An overlay error data 122 is an overlay error of the interconnection structure and a corresponding error source data 124 is the tool signal of the wafer processing toolset 112 that is obtained or recorded with respect to forming the interconnection structure.

The big data unit 130 also harmonizes the collected data regarding the measurement scale, measurement units, time scale, tolerance threshold, etc., such that the data entries are able to be used in a same analysis process. The big data unit 130 also enhances the collected data with respect to data entry missing and data entry interpolation. Other data processing, harmonization, or combination techniques are also possible and included within the big data unit 130.

The other data 126 may be historical data on overlay error data or error source data with respect to previously processed wafers. Such historical data are processed in a same or similar manner as the overlay error data 122 and the error source data 124 within the big data unit 130.

The machine learning unit 140 is an artificial intelligence machine learning unit configured to conduct a learning process using the data provided by the big data unit 130 to conclude a classification that can predict an overlay error of a feature on a semiconductor wafer based on measured processing parameters, e.g., the error source data, of the example stepper machine that is used to do the photolithography of the feature. The overlay error data 122 and the error source data 124 may be divided into three data sets: training data set, validation data set and test data set. The machine learning unit 140 may use the different data set to train the base classification, the Meta classification and to test the fitness of the stack of the base classification and the Meta classification in predicting overlay errors as described herein.

The alignment control unit 142 is configured to use the regression model functions or the overlay estimation/prediction results to control the overlay alignment on wafer processing, e.g., the wafer processing of interconnections on fan-out WLP. Specifically, the alignment control unit 142 may apply processing log information of a wafer processing operation as inputs into the regression model functions to generate alignment control output data 150. The alignment control output data may then be used to control or adjust the wafer processing. For example, the alignment control output data 150 includes, among others, error prediction data 152 and corrective adjustment data 154. The error prediction data 152 indicates a predicted/estimated overlay metrology in one or more of wafer positions. The corrective adjustment data 154 indicates a change in one or more of the error source factors in the error source data 124 to eliminate an estimated/predicted overlay error.

In an embodiment, the alignment control unit 142 is part of the machine learning unit 140. In other embodiments, the alignment control unit 142 is a separate unit from the machine learning unit 140 and includes mechanisms to automatically adjust or cause to adjust one or more of the wafer processing tool settings or the wafer positions to eliminate overlay errors.

The validation unit 144 of the machine learning unit 140 is configured to validate or adjust the parameters of the regression model function in the validation data set. The regression model function may be validated in various approaches. For example, an estimated overlay metrology value based on an overlay source factor in the validation data set may be compared with a corresponding actual metrology value in the validation data set. The difference between the estimated metrology value and the actual metrology value is used to adjust the classification parameters of the regression model function. After the validation procedure, the classification parameters of the regression model function are finalized.

The test unit 146 is configured to evaluate whether the finalized regression model function fits the data in the test data set. For example, in a case that the finalized regression model function is a linear regression function, an R-square value $R^2$, $R^2$=explained variation/total variation, is used to determine whether the final regression model fits the data in the test data set. For example, a threshold value may be used to determine whether the $R^2$ value is sufficiently large indicating that the final regression model function sufficiently fits the test data set. For example, a threshold is used to evaluate each predicted overlay value with the actual overlay metrology value in the test data set. The threshold value may be determined based on the overlay tolerance requirements of the features or the layers on the workpiece. For example, in fan-out WLP, a threshold value of about 0.1 μm may be chosen to determine whether an estimate overlay metrology value meets the actual metrology data of an interconnection feature over a die packaged in the fan-out WLP.

Figure 2:
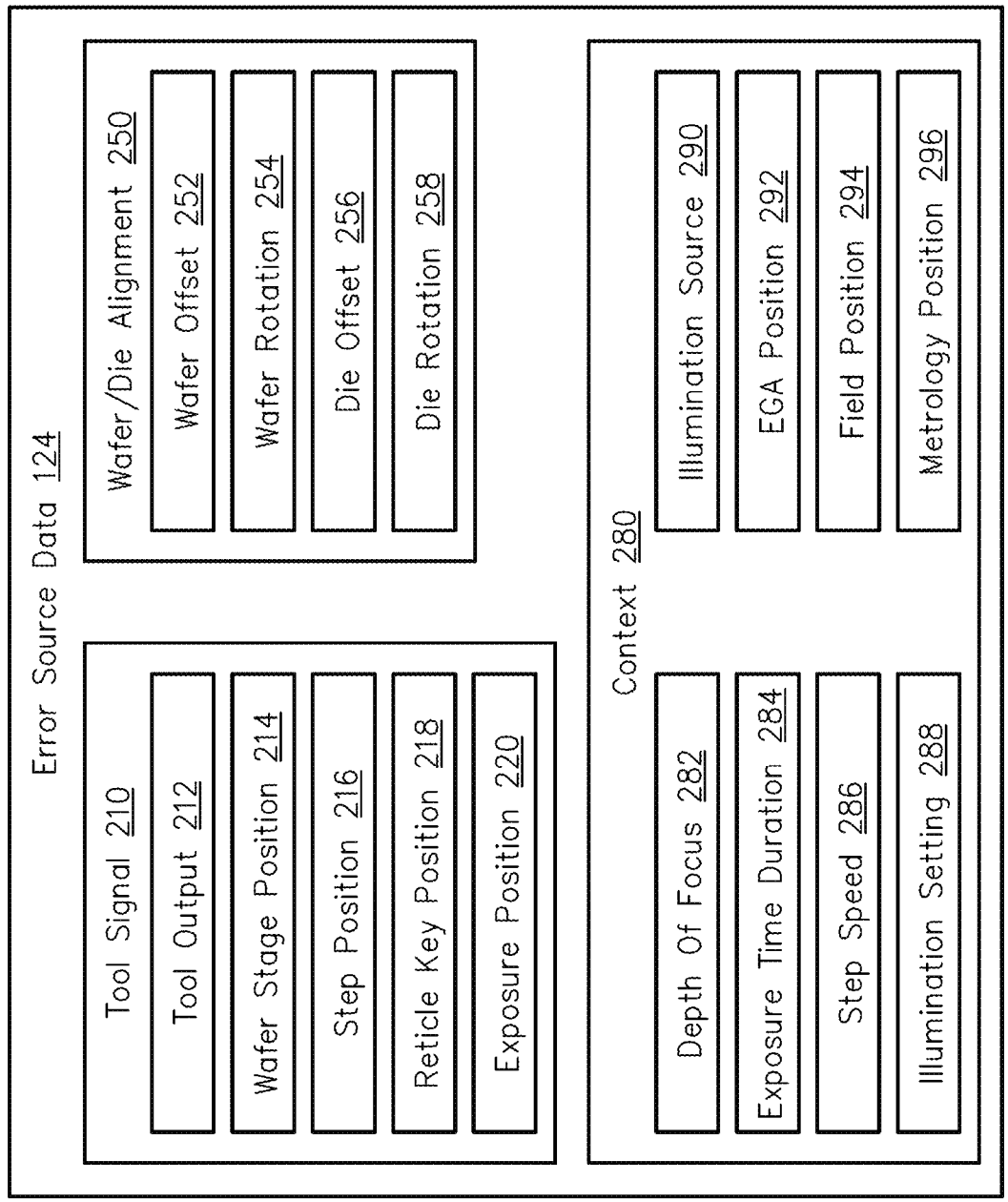
FIG. 2 is an example error source data set.

FIG. 2 shows an example error source data 124. The error source data 124 includes a sub-set 210 of tool signal error source factors, a sub-set 250 of wafer/die alignment error source factors and a sub-set 280 of context error source factors. The tool signal sub-set 210 includes data on the tool characteristics or parameters or settings that affect the overlay alignment or relates to the overlay alignment of features on the workpiece. In an embodiment, the tool alignment sub-set 210 includes tool output signal data 212, wafer stage position data 214, step position data 216, reticle key position data 218, exposure position data 220 or other suitable tool signal data. The wafer/die alignment sub-set 250 includes data on the positions of a wafer on a wafer stage or a die on a wafer (in the fan-out WLP scenarios) that affects overlay alignment. The context error source sub-set 280 includes the context information about the overlay metrology measurements. With the context information included, different types of wafer and different wafer processing parameters may be identified and considered in the machine learning process. In an embodiment, regression model functions are separately determined or trained for different types of wafers and/or different wafer processing parameters. For example, different training data sets of overlay error source factors and overlay errors are maintained for each type of wafers and/or each set of wafer processing parameters. The different training data sets are updated separately to maintain the fixed number of data entries in each training data sets.

In some embodiments, the tool output signal data 212 is a deviation data that represents a difference between a detected tool signal value and a benchmark tool signal value. For example, the tool output signal data 212 is a difference between a detected tool output signal and a benchmark tool output signal value; the wafer stage position data 214 is a difference between a detected wafer stage portion and a benchmark wafer stage position; the step position data 216 is a difference between a detected step position and a benchmark step position; the reticle key position data 218 is a difference between a detected reticle key position and a benchmark reticle key position; and the exposure position data 220 is a difference between a detected exposure position and a benchmark exposition position.

The benchmark tool signal values may be predetermined or may be dynamically determined. In some embodiments, a best historical signal value of a tool may be dynamically determined and used as the benchmark tool signal value of the tool. A best historical signal value may be determined in various categories of tool signals of a tool.

The wafer stage position data 214 may be measured by the positions of the actuators that anchor the wafer stage. For example, a wafer stage may include three actuators for anchoring the x-axis, y-axis and z-axis positions of the wafer stage. The positions of the x-axis, y-axis, and z-axis actuators are recorded and logged to indicate the wafer stage positions.

The step position data 216 is the position of the stepper.

The reticle key position data 218 indicates the positions of the reticle that is anchored by the reticle keys.

The exposure position data 220 indicates a position or area on the wafer that is exposed to the illumination light.

The wafer stage position 214, step position 216, reticle key position 218 or exposure position 220 may be represented as locations in the x-axis, y-axis in the lateral plane and/or z-axis in the vertical plane. In some embodiments, the wafer stage position 214, step position 216, reticle key position 218 or exposure position 220 may each be represented as position errors to the respective target positions. In the measurement of position errors, an x-axis offset, an y-axis offset, an z-axis offset, and a rotation error (in angle) may be used. In some embodiments, the target positions may be used as the benchmark positions.

In the wafer/die alignment sub-set 250, the wafer offset data 252 indicates an offset amount of a wafer on the wafer stage. The wafer offset includes offset in x-axis and offset in y-axis. In an embodiment, the wafer offset is determined through wafer alignment marks included on a wafer, or other suitable mechanisms.

The wafer rotation data 254 indicates an angle of rotation of a wafer on the wafer stage. In an embodiment, the wafer rotation is determined through wafer alignment marks or other suitable mechanisms.

The die offset data 256 indicates an offset amount of a die on a carrier wafer. The die offset includes x-axis offset and y-axis offset. In an embodiment, the die offset is determined through die alignment marks included on a die, or other suitable mechanisms.

The die rotation data 258 indicates an angle of rotation of a die on a carrier wafer. In an embodiment, the die rotation is determined through die alignment marks or other suitable mechanisms.

The context data 280 may include depth of focus, exposure time duration, step speed, illumination setting, illumination source, EGA position, field position, metrology position or other context data. In some embodiments, the context data is used to make sure that the learned regression model functions between tool signals and overlay error metrology are specific for the type of wafers, process procedures, features or other context factors.

It should be appreciated that the example error source data categories listed in FIG. 2 are examples and do not limit the scope of the disclosure. Other factors that contribute to the occurrence and/or size of an overlay error may also be used and included in the error source data 124, which are all included in the disclosure.

Figure 3:
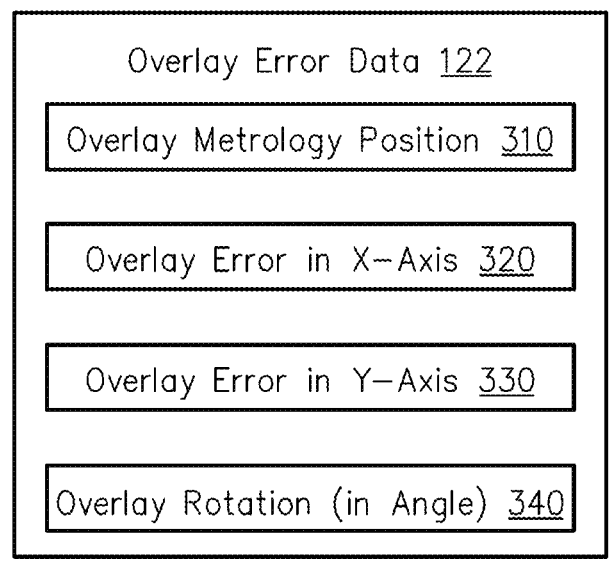
FIG. 3 is an example overlay error data set.

FIG. 3 shows an example overlay error data 122. As shown in FIG. 3, the overlay error data 122 includes four overlay error categories, an overlay metrology position data 310, an overlay error in x-axis data 320, an overlay error in y-axis data 330, and an overlay rotation (in angle) data 340. The overlay metrology position data 310 indicates where, on a wafer or on a die, an overlay error is. The overlay error in x-axis data 320 and the overlay error in y-axis data 330 indicate the size of an overlay error in the x-axis or the y-axis, respectively. The overlay rotation (in angle) data 340 indicates an overlay error where the actual metrology of a feature deviates from the target metrology by an angle.

Various approaches may be used to define an overlay error. In an embodiment, an overlay error is determined as a difference between an actual metrology and a target metrology of a feature. In another embodiment, an overlay error is determined based on the alignment between corresponding features, e.g., an upper feature and a lower feature that are configured to vertically align with one another. Other approaches to determine overlay alignment accuracy or an overlay error are also possible and included within the scope of the disclosure.

Figure 4:
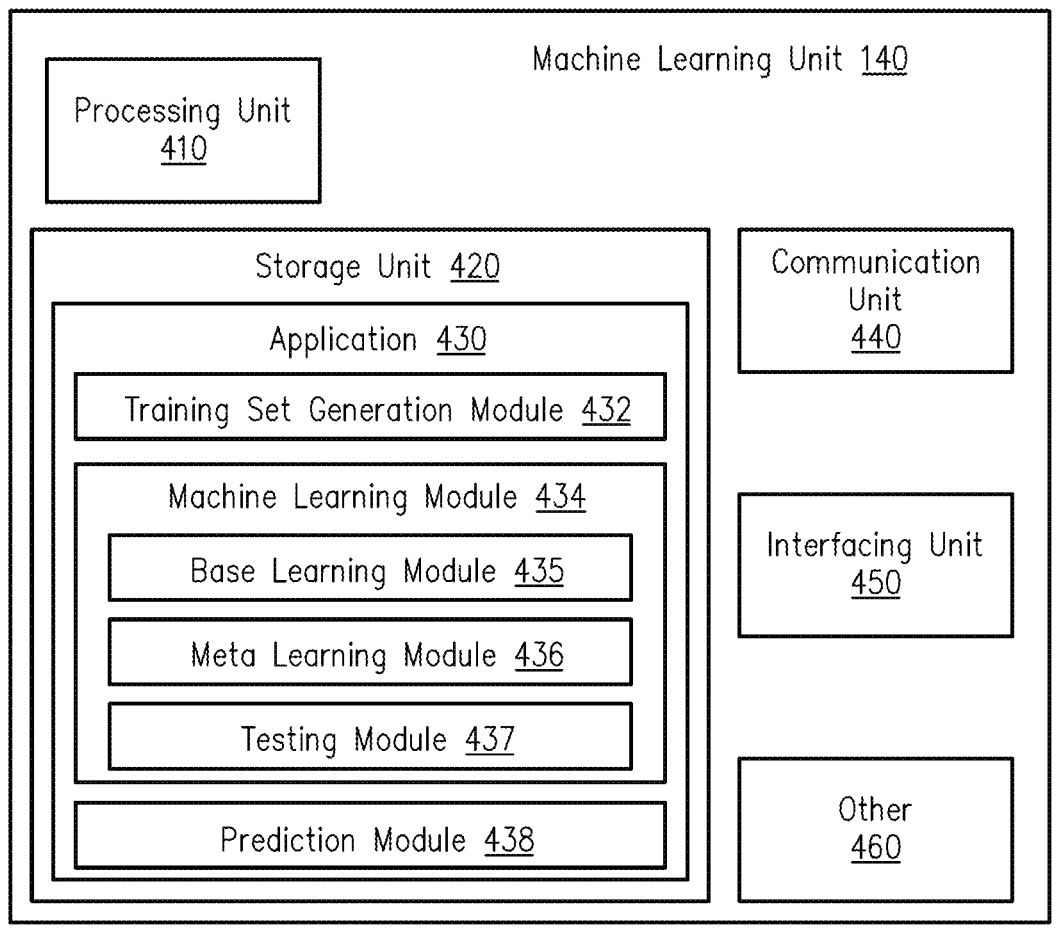
FIG. 4 is an example machine learning unit.

FIG. 4 shows an example machine learning unit 140. Referring to FIG. 4, the machine learning unit 140 includes a processing unit 410, e.g., a computer processor or a processing capacity allocated to the machine learning unit 140 in a virtual machine application, a storage unit 420 having a machine learning application 430 stored thereon, a communication unit 440 configured to communicate with other computers or machines linked to the machine learning unit 140 in a distributed computing environments, an interfacing unit 450 configured for inputs, outputs and user interactions, and other components 460.

The application 430 includes executable instructions which, when executed by the processing unit 410, configure the processing unit 410 to implement a training set generation module 432, a learning module 434, and a prediction module 438. The learning module 434 includes a base learning module 435, a Meta learning module 436 and a testing module 437. In an embodiment, the executable instructions dedicated for implementing the training set generation module 432, the learning module 434, and the prediction module 438 are stored in separate dedicated spaces of the storage unit 420 or in a separable/parsable manner such that executable instructions for these modules are easily identified through parsing or indexing.

Figure 5:
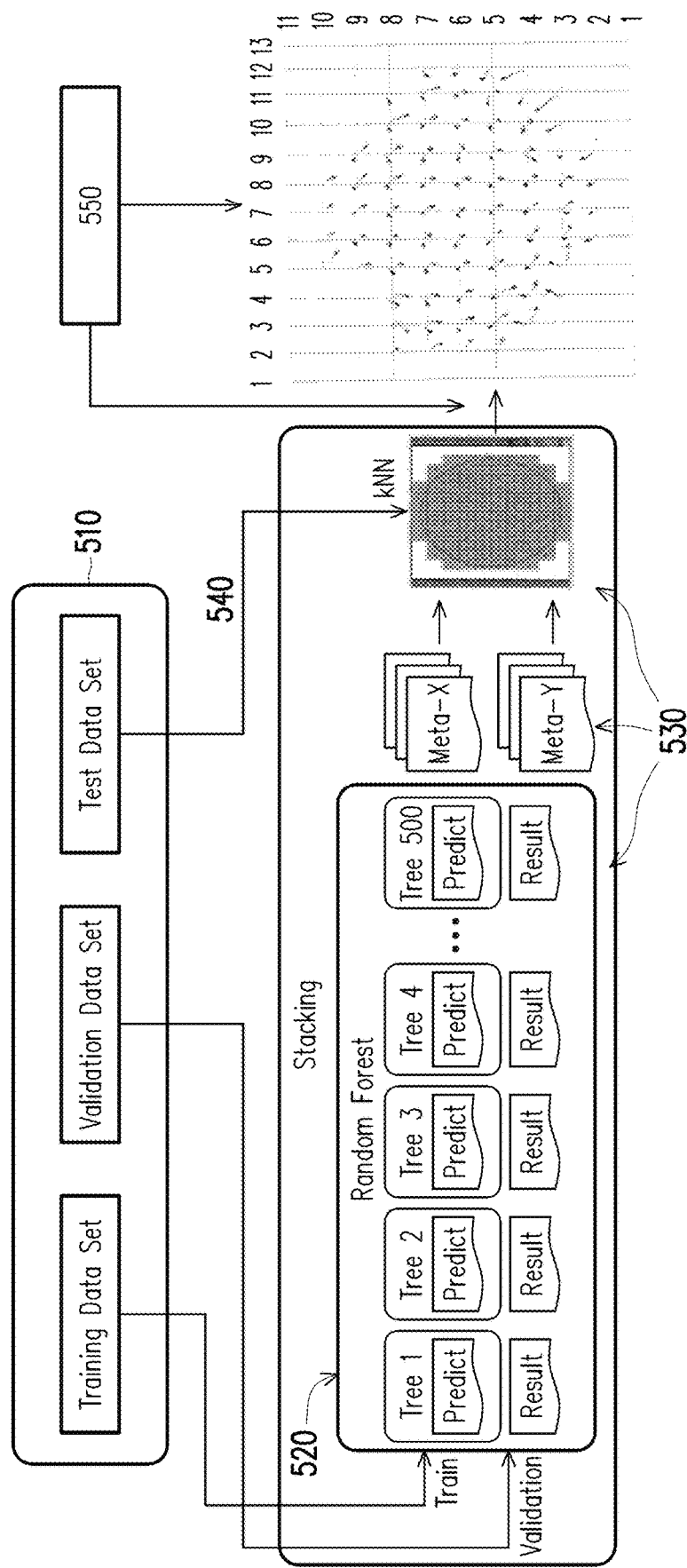
FIG. 5 is an example operation of the machine learning unit.

FIG. 5 shows an example operation structure 500 of the learning module 434 of the application 430. In operation, the training set generation module 432 receives data from the big data unit 130 and generates, in operation 510, three disjoint data sets: a training data set, a validation data set and a test data set. Each of the training data set, the validation data set and the test data set includes similar categories of data entries of error source data and overlay error data. In some embodiments, the learning module 434 implements a stack of multiple tiers of learning procedure using one or more of the training data set, the validation data set and the test data set.

In example operation 520, the base learning module 435 trains multiple base classifications using the training data set. Each of the multiple base classifications represents a correlation, e.g., a regression or a decision tree, between the error source data and the overlay error data. In some embodiments, the base learning unit 435 uses the Random Forest model in training the parameters of each of the multiple base classifications the training data set. For example, the error source data in the training data set, e.g., the process parameters of the wafer processing tool set 112 in processing a semiconductor wafer, is used as inputs and the corresponding overlay error data in the training data set, e.g., measured overlay data of a feature on the semiconductor wafer, is used as outputs to train the parameters of the base classification under the Random Forest model. The Random Forest Model finds, among multiple classifications (or decision trees) that each links the error source data and the overlay error data, a classification that represents either the mode or the mean prediction of the overlay errors of the multiple classifications. For example, in the Random Forest model, a multitude of decisions trees, e.g., 500 decisions trees Tree 1-Tree 500 shown in FIG. 5, are trained, each decision tree leading a "path" from an input of overlay source to an output of overlay prediction. The parameters of each tree are determined or trained using the training data set. In some embodiments, a mode value, a median value or a mean value of the outputs of the multitude of decision trees in response to a same input may be taken as the output of the Random Forest model.

After the parameters of the base classification have been determined, in example operation 530, the Meta learning module 436 trains a Meta classification using the validation data set. In some embodiments, the error source data of the validation data set, e.g., the process parameters of the wafer processing tool set 112 in processing a semiconductor wafer, are fed into the trained base classifications to make predictions on overlay errors. The predicted or estimated overlay errors, classified as Meta X or input data for the Meta classification, and the actual overlay metrology data from the validation data set, e.g., measured overlay data of a feature on the semiconductor wafer, classified as Meta Y or output data for the Meta classification, are used together to train the Meta classification. In some embodiments, the Meta learning module 436 uses an Inverse Distance Weighting k-Nearest Neighbors regression (IDW-kNN) as a model to represent the relationship between the predicted overlay errors generated by the base classification (or the Meta X) and the actual overlay errors in the validation data set (or the Meta Y). The parameters of the Meta classification of IDW-kNN are thus obtained.

In example operation 540, the testing module 437 determines whether the stack classification that includes the base classifications and the Meta classification fits the test data set. That is, the testing module 437 determines whether the predicted overlay errors are consistent with or deviate from the actually measured overlay errors. For example, the error source data of the test data set is fed into the base classifications to obtain the Meta X data. The Meta X data is then fed into the Meta classification to obtain the predicted or estimated overlay error data, Meta Y. The predicted overlay error data is compared to the corresponding actual overlay metrology data in the test data set to evaluate whether the predicted overlay errors are consistent with or deviate from the actually measured overlay errors. In some embodiments, an R-Square value is calculated based on the predicted overlay errors and the corresponding actually measured overlay errors and is analyzed with a threshold value to determine whether the stack classification fits the test data set. Using the test data set instead of the training data set and/or the validation data set to evaluate the fitness of the stack classification helps to avoid the overfitting problem.

If the stack classification is determined as fit, it is ready to be used to predict overlay metrology errors. If the stacked classification is determined as not fit, one or more of the parameters of the base classifications or the Meta classification may be adjusted to improve the fitness score of the stack classification. For example, new training data or validation data may be used to re-train the parameters of the base classifications and/or the Meta classifications.

In prediction operation 550, after the parameters of the base classification and the meta classification have been determined, the base classification and the Meta classification are used together as a stack of classifications to perform overlay error prediction in real semiconductor chip fabrication process. For example, the prediction module 438 uses the stack classification to predict or estimate an overlay metrology of a feature on a wafer based on the measured process parameters of the wafer processing operation of making the wafer. Specifically, for example, the error source data, e.g., the tool signals, is obtained from the processing log 114 and is applied into the trained stack classification as input to predict the overlay metrology data as an output. The prediction module 438 may also predict a corrective adjustment(s) on the wafer processing parameters, e.g., on one or more of the tool alignment settings and/or the wafer/die alignment factors, to eliminate or mitigate an estimated/predicted overlay error.

The prediction of the overlay errors may be conducted for a whole wafer. Within the wafer, the overlay errors may follow a consistent pattern or may vary between/among different fields on the wafer. With the stepper devices used in the wafer processing, it is possible to adjust the wafer processing settings to specifically correct the overlay errors on an individual field on the wafer. However, there are scenarios that overlay errors on two or more fields on the wafer that cannot be individually corrected and are interrelated under the wafer processing operations. A decision making operation may be conducted to determine an overall corrective adjustment(s) of the wafer processing operation to balance between/among with the two or more fields on overlay alignment.

In some embodiments, the corrective adjustments are determined based on zones on a wafer. For example, features on the wafer are grouped into a plurality of subsets contained in corresponding zones on the wafer surface. The plurality of zones are ring-shaped and are concentric to one another. The predicted overlay errors of each subset of features are averaged, e.g., a mean or a median, to obtain an average overlay error of the zone. The corrective adjustment for the zone is determined based on the average overlay error of the zone.

The results of the overlay prediction operation 550 are output to the alignment control unit 142 to control the wafer processing operation accordingly. For example, the error prediction data 152 may be used to manually adjust the wafer processing parameter settings to avoid or reduce the overlay error problem. The corrective adjustment data 154 may be used by an operator or a machine to automatically adjust the wafer processing parameter settings to improve overlay alignment accuracy. The adjusted processing parameters and the related overlay metrology data again are fed into the machine learning unit 140 to further train or refine the classification because they together represent a new data entry. That is, the machine learning process in the machine learning unit 140 may be a dynamic process, which continuously updates the classifications using new data entries.

Figure 6:
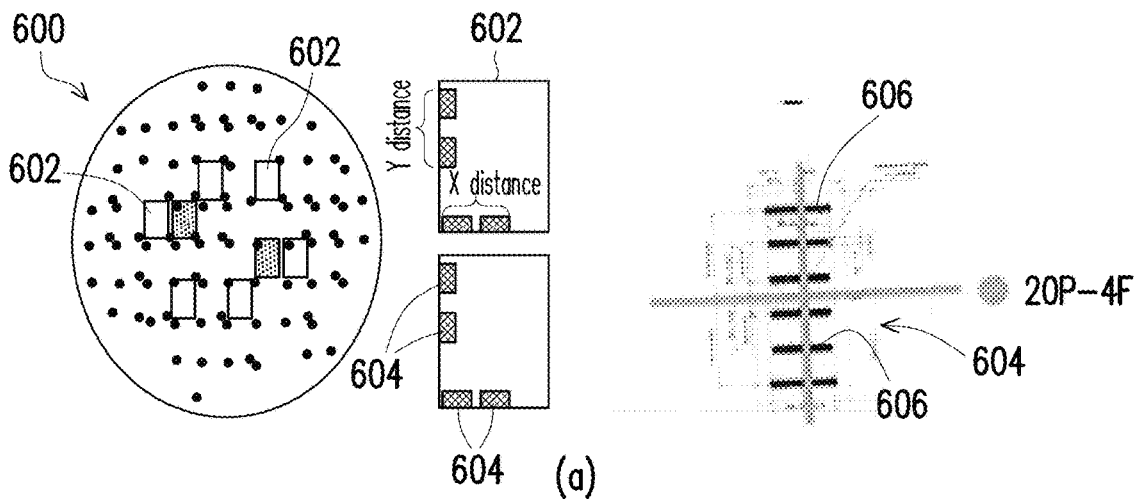
FIG. 6 is an example of obtaining tool signal data.
Figure 6:
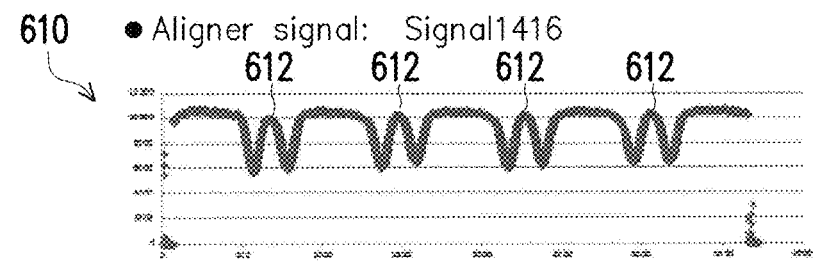
Figure 6:
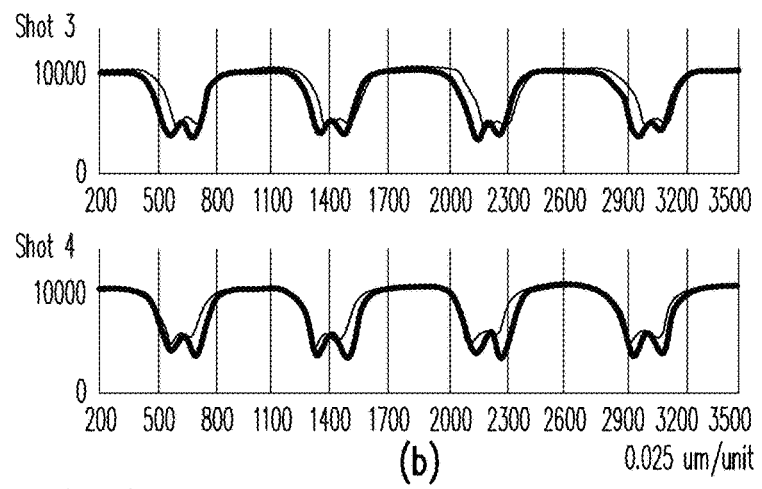
Figure 6:
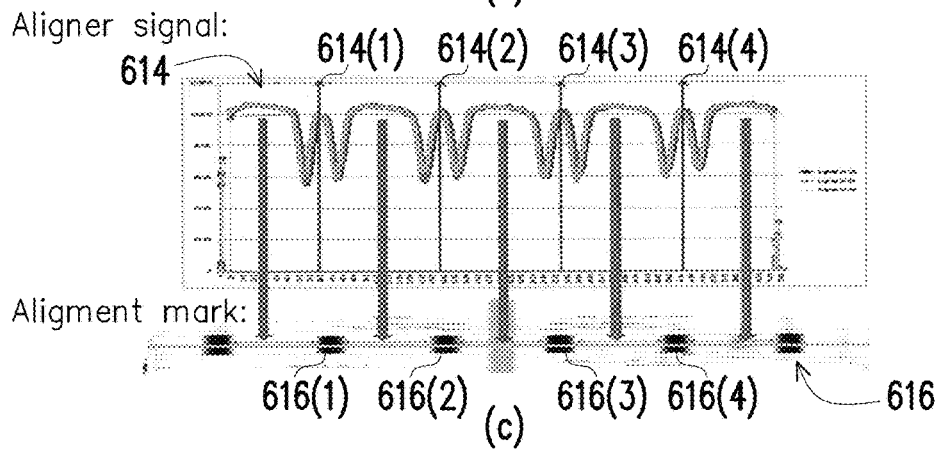

FIG. 6 shows example process of obtaining tool signal data as an example of overlay source data, which can be used in the training data set, the validation data set, and/or the test data set. As an illustrative example, FIG. 6 shows a process of obtaining an example output signal of a stepper machine (or aligner tool), as an example of a process tool set 112, which does not limit the scope of the disclosure. As shown in FIG. 6(*a*), an example wafer 600 includes a plurality of alignment dies 602, six shown for illustration, which are designated for tuning overlay alignment. Each alignment die 602 contains a plurality of alignment marks 604 arranged along the x-axis or the y-axis. Each alignment mark 604 includes a plurality of alignment mark lines 606.

The output signal characteristics of the stepper machine affect the alignments of the light exposure in a photolithography process and thus affect the location of a feature on a semiconductor wafer. As such, the output signal characteristics can be used as error source data. As an example of the output signal characteristics, as shown in FIG. 6(*b*), the signal waveforms of the aligner output signal on each alignment mark 604 are obtained. FIG. 6(*b*) shows, for illustration, the signal waveforms for two alignment marks Mark 3, Mark 4 of an alignment die 602. Each waveform 610 includes a plurality of peaks 612, four peak points 612 shown for illustration, which each corresponds to an alignment mark lines 606.

Ideally, the peaks of the waveform should align with the alignment marks. The alignment or misalignment between the peaks of the waveform and the corresponding alignment marks then serves as an indication that the output signal of the stepper machine may cause overlay errors. For example, as shown in FIG. 6(*c*), one or more of the peak points 612 are converted into location coordinates 614, 614(1), 614(2), 614(3), 614(4) shown for illustration. The locations coordinates 614 obtained from the aligner signal output, referred to as "signal location coordinate," are compared to the corresponding location coordinates 616 of the alignment mark lines 606 that are obtained from the graphic database system GDS data, referred to as "GDS location coordinate." Specifically, signal location coordinates 614(1), 614(2), 614(3), 614(4) are compared to the GDS location coordinates 616(1), 616(2), 616(3), 616(4) to determine the offset value between the output signal and the alignment mark lines. The offset values are referred to as signal characteristics.

Figure 7:
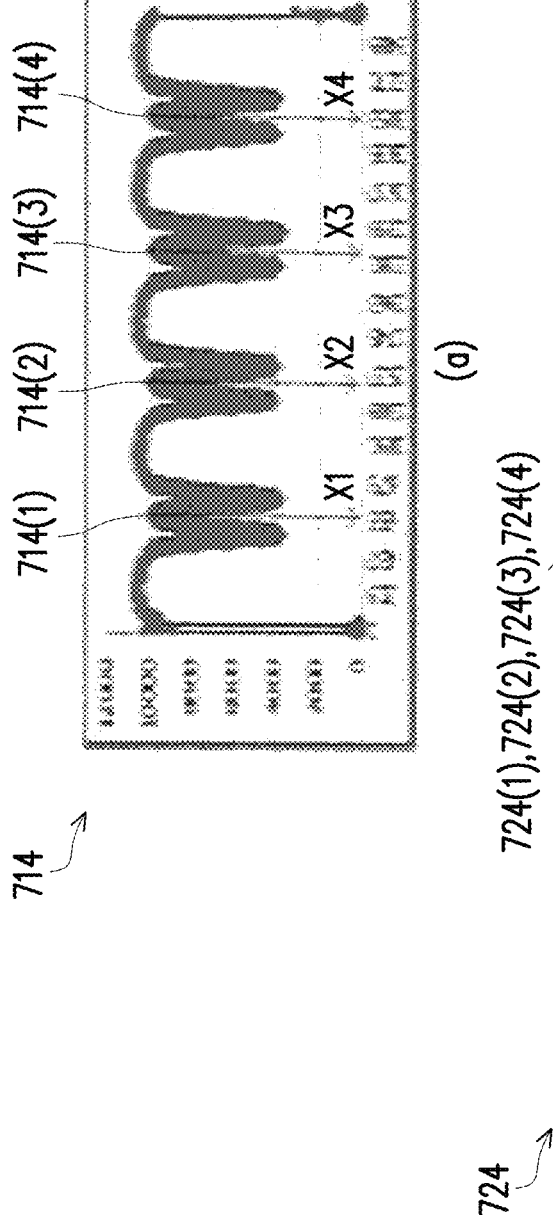
FIG. 7 is a table showing example of tool signal data.

FIG. 7 shows an example process of forming data entries containing tool output signal characteristics and measured overlay metrology data. In FIG. 7(a), a plurality of signal characteristic data 714, 714(1), 714(2), 714(3), 714(4) shown for illustration, are obtained for each alignment mark 604. The signal characteristics 714(1), 714(2), 714(3), 714 (4) each indicates the alignment or misalignment between the output signal and the alignment mark lines, e.g., the differences between signal location coordinates 614(1), 614 (2), 614(3), 614(4) and the corresponding GDS location coordinates 616(1), 616(2), 616(3), 616(4).

FIG. 7(b) shows data of a plurality of light exposures made by the aligner tool, e.g., shots 18, 16, 25, 26, 36, 35, 46, 48 of the aligner tool. For each shots 18, 16, 25, 26, 36, 35, 46, 48, the overlay metrology data in y-axis, OVL Box R/D, OVL Box L/U and Mean-Y, are obtained as corresponding the aligner output signal. The OVL Box R/D and OVL Box L/U are the overlay errors in y-axis obtained from two locations on the wafer. The Mean-Y is a mean value of the OVL Box R/D and OVL Box L/U. The tool signal data 724 are also obtained for each of the shots 18, 16, 25, 26, 36, 35, 46, 48. Specifically, the tool signal data 724 with respect to each alignment mark 10, 12, 2, 4, 6, 8 is obtained as a difference between the signal characteristics 714 of a specific shot with respect to the signal characteristics 714 of a benchmark shot, here the shot 35. For example, for alignment mark 10, the signal characteristics 714(1), 714(2), 714(3), 714(4) of the shot 18 are compared to the signal characteristics 714(1), 714(2), 714(3), 714(4) of the benchmark shot 35, which results in the tool signal values "−15", "−18", "−18", "−18" for the four alignment mark lines. The "+" or "−" of the tool signals 724 indicates a direction of the deviation, e.g., larger or smaller, which can be randomly designated. Note that for the benchmark shot 35, all tool signals are "0" because the respective signal characteristics do not deviate from themselves.

In some embodiments, the benchmark shot is selected as the shot of the aligner that has the smallest overlay error. As an illustrative example, the shot 35 of FIG. 7(b) has a mean y-axis overlay error of "0.010066702," which is the smallest among the shots 18, 16, 25, 26, 36, 35, 46, 48. In some embodiments, the benchmark shot may be dynamically selected. For example, if new data is added into a data pool, which includes a better shot than the current benchmark shot 35, the better shot may be selected as a new benchmark shot. Correspondingly, the signal characteristics 714 of the new benchmark shot will be used to generate new tool signals 724 of each shot in the data pool.

Figure 8:
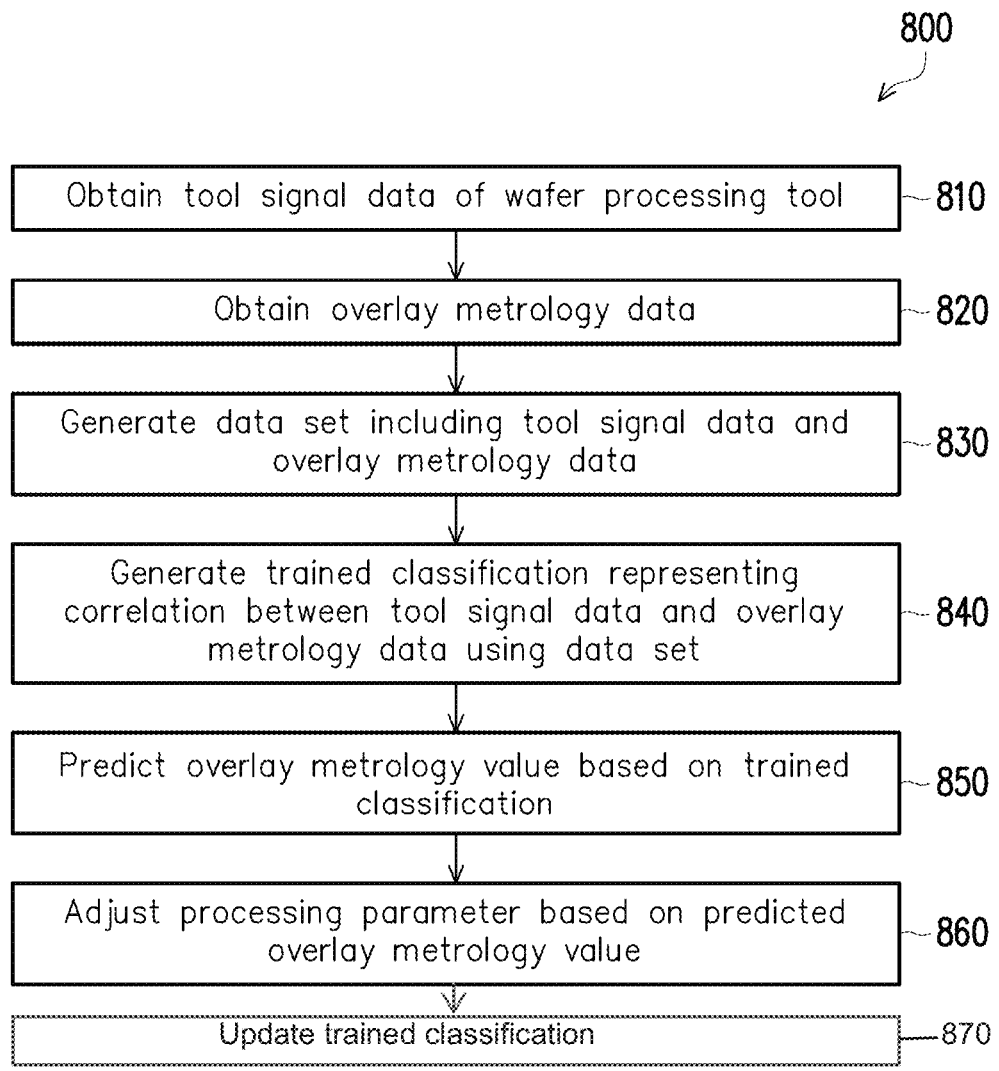
FIG. 8 is an example process of managing overlay alignment.

FIG. 8 is a flow diagram of an example operation process 800. In example operation 810, the process log 114 obtains a tool signal data of a wafer processing tool, e.g., an aligner, with respect to forming an interconnection feature on a first wafer.

In example operation 820, the metrology tool set 116 obtains overlay metrology data with respect to the interconnection feature on the first wafer.

In example operation 830, the training set generation module 432 generates a data set including the tool signal data and the overlay metrology data with respect to the first wafer.

In example operation 840, the machine learning module 434 generates a trained classification representing a correlation between the tool signal data and the overlay metrology data using the data set. In some embodiments, the trained classification may include a stack of base classifications and one or more Meta classifications.

In example operation 850, the prediction module 438 predicts an overlay metrology value on a second wafer based on the trained classification. For example, a tool signal with respect to the second wafer may be applied to the trained classification to generate a predicted overlay metrology value.

In example operation 860, the alignment control unit 142 adjusts, e.g., through the corrective adjustment data 154, the tool signal or other processing parameters in processing the second wafer based on the predicted overlay metrology value.

In example operation 870, the trained classification is updated based on the measured overlay metrology data on the second wafer and the tool signal data with respect to the second wafer.

The techniques are described with fan-out WLP processes as an example. It should be appreciated that the techniques are similarly applicable to front-end wafer processing and other back-end wafer processing operations.

The present disclosure may be further appreciated with the description of the following embodiments.

In some embodiments, a method includes determining a tool signal of a wafer processing tool with respect to forming a first feature on a first wafer; determining a first value of an overlay metrology of the first feature; generating a first data set including the tool signal and the first value of the overlay metrology; generating a classification correlating the tool signal and the overlay metrology based on the first data set, the classification including a base classification and a meta classification; and estimating a second value of the overlay metrology of a second feature on a second wafer using the classification.

In some embodiments, a system includes a wafer processing tool operable to form a plurality of features on a wafer, the plurality of features including a first subset of features positioned in a first zone on the wafer and a second subset of features positioned in a second zone on the wafer; a metrology tool operable to measure a plurality of overlay metrology values of the plurality of features on the wafer; an overlay modeling tool operable to generate a plurality of estimated overlay metrology values of the plurality of features based on tool signal data of the wafer processing tool; and a process control tool operable to adjust an operation of the wafer processing tool based on a first zone-based adjustment value of the first zone and a second zone-based adjustment value of the second zone, the first zone-based adjustment value being based on estimated overlay metrology values of the first subset of features, and the second zone-based adjustment value being based on estimated overlay metrology values of the second subset of features.

In some embodiments, a computing system includes a processor and a storage unit having executable instructions stored thereon. The executable instructions, when executed by the processor, configures the processor to implement actions including receiving data on a tool signal of a wafer processing tool with respect to forming a first feature on a first wafer; receiving data on an overlay metrology of the first feature; generating a data pool including the data on the tool signal and the data on the overlay metrology; learning a stack classification that includes a first classification and a second classification, the first classification and the second classification being learned based on a first subset and a second subset of data from the data pool; and estimating an overlay metrology of a second feature on a second wafer using the stack classification.

The various embodiments described above can be combined to provide further embodiments.

These and other changes can be made to the embodiments in light of the above detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    determining a tool signal of a wafer processing tool with respect to forming a first feature on a first wafer;
    determining a first value of an overlay metrology of the first feature;
    generating a first data set including the tool signal and the first value of the overlay metrology;
    generating a classification correlating the tool signal and the overlay metrology based on the first data set, the classification including a base classification and a meta classification, wherein the base classification is trained to have an estimated overlay metrology value as an output, the meta classification is trained to use the estimated overlay metrology value of the base classification as an input and an actual overlay metrology measurement as an output, and the base classification and the meta classification are trained using different subsets of data of the first data set; and
    estimating a second value of the overlay metrology of a second feature on a second wafer using the classification.

2. The method of claim 1, wherein an output of the base classification obtained using a subset of data for training the meta classification is used as an input of the meta classification in training the meta classification.

3. The method of claim 1, wherein the first data set is randomly divided into a training data set and a validation data set, the base classification is generated based on the training data set, and the Meta classification is generated based on the validation data set.

4. The method of claim 3, further comprising determining a fitness score of the classification using a test data set, the test data set being part of the first data set.

5. The method of claim 1, wherein the tool signal is a difference between a signal of the wafer processing tool in forming the first feature on the first wafer and a benchmark signal of the wafer processing tool.

6. The method of claim 5, wherein the benchmark signal is a historical signal of the wafer processing tool that forms a feature on a wafer with an overlay error of a historically smallest size.

7. The method of claim 6, wherein the benchmark signal is dynamically determined.

8. The method of claim 1, wherein the base classification is a Random Forest model classification.

9. The method of claim 1, wherein the Meta classification is an Inverse Distance Weighting k-Nearest Neighbors regression.

10. The method of claim 1, further comprising adjusting an operation of the wafer processing tool based on the estimated second value of the overlay metrology.

11. The method of claim 10, wherein the adjusting the operation of the wafer processing tool is based on estimated overlay metrology values of a plurality of zones on the second wafer.

12. The method of claim 11, wherein an estimated overlay metrology value of a zone of the plurality of zones is an average value of one or more estimated second values of the overlay metrology on one or more second features within the zone.

13. A system, comprising:
    a wafer processing tool operable to form a plurality of features on a wafer, the plurality of features including a first subset of features positioned in a first zone on the wafer and a second subset of features positioned in a second zone on the wafer;
    a metrology tool operable to measure a plurality of overlay metrology values of the plurality of features on the wafer;
    an overlay modeling tool operable to generate a plurality of estimated overlay metrology values of the plurality of features based on tool signal data of the wafer processing tool, wherein the overlay modeling tool includes a base classification and a meta classification, the base classification uses tool set information of the wafer processing tool in forming the plurality of features as an input and a first estimated overlay metrology value as an output, the meta classification is trained to use the first estimated overlay metrology value of the base classification as an input to generate a second overlay metrology value as an output, and the base classification and the meta classification are trained using different data sets; and
    a process control tool operable to adjust an operation of the wafer processing tool based on a first zone-based adjustment value of the first zone and a second zone-based adjustment value of the second zone, the first zone-based adjustment value being based on estimated overlay metrology values of the first subset of features, and the second zone-based adjustment value being based on estimated overlay metrology values of the second subset of features.

14. The system of claim 13, wherein the overlay modeling tool is operable to update one or more of the base classification or the meta classification using an overlay metrology measurement of the plurality of features.

15. The system of claim 14, wherein the classification includes a plurality of base classifications and the meta classification, an average of outputs of the plurality of base classifications being inputs of the meta classification.

16. The system of claim 13, wherein the first zone and the second zone are concentric to one another.

17. The system of claim 13, wherein the first zone-based adjustment value is an average of the estimated overlay metrology values of the first subset of features, and the second zone-based adjustment value is an average of the estimated overlay metrology values of the second subset of features.

18. A computing system, comprising:
    a processor; and
    a storage unit having executable instructions stored thereon which, when executed by the processor, configures the processor to implement actions including:
        receiving data on a tool signal of a wafer processing tool with respect to forming a first feature on a first wafer;
        receiving data on an overlay metrology of the first feature;
        generating a data pool including the data on the tool signal and the data on the overlay metrology;
        learning a stack classification that includes a first classification and a second classification, the first classification and the second classification being learned based on a first subset and a second different subset of data from the data pool, wherein the base classification is trained to have an estimated overlay metrology value as an output, and the meta classification is trained to use the estimated overlay metrology value of the base classification as an input and an actual overlay metrology measurement as an output; and estimating an overlay metrology of a second feature on a second wafer using the stack classification.

19. The computing system of claim 18, wherein the first classification correlates the tool signal and the overlay metrology.

20. The computing system of claim 19, wherein the learning the second classification includes:

generating estimated overlay metrology data by applying tool signal data of the second subset of data into the first classification; and learning the second classification based on the estimated overlay metrology data and the overlay metrology data of the second subset of data.

* * * * *